US012713684B2

(12) United States Patent
You et al.

(10) Patent No.: US 12,713,684 B2
(45) Date of Patent: Aug. 18, 2026

(54) INTEGRATED CIRCUIT AND METHOD OF MANUFACTURING THE SAME

(71) Applicant: SAMSUNG ELECTRONICS CO., LTD., Suwon-si (KR)

(72) Inventors: Hyeongyu You, Hwaseong-si (KR); Jungho Do, Hwaseong-si (KR); Sangdo Park, Seongnam-si (KR); Jaewoo Seo, Seongnam-si (KR); Jisu Yu, Seoul (KR); Minjae Jeong, Hwaseong-si (KR); Dayeon Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 590 days.

(21) Appl. No.: 17/984,417

(22) Filed: Nov. 10, 2022

(65) Prior Publication Data

US 2023/0142050 A1 May 11, 2023

(30) Foreign Application Priority Data

Nov. 11, 2021 (KR) ........................ 10-2021-0155155
Feb. 23, 2022 (KR) ........................ 10-2022-0023831

(51) Int. Cl.
*H10D 84/00* (2025.01)
*H10D 1/00* (2025.01)
(Continued)

(52) U.S. Cl.
CPC ............. *H10D 84/00* (2025.01); *H10D 1/043* (2025.01); *H10D 1/714* (2025.01); *H10D 89/10* (2025.01)

(58) Field of Classification Search
CPC .... H10D 89/10; H10D 84/903; H10D 84/907; H10D 84/975
See application file for complete search history.

(56) References Cited

U.S. PATENT DOCUMENTS 6,483,131 B1 * 11/2002 Ko ......................... H10D 89/10 438/129
10,402,534 B2 9/2019 Huang et al.
(Continued)

FOREIGN PATENT DOCUMENTS

CN 110036477 A * 7/2019 ........... H01L 23/522
KR 10-2020-0008528 A 1/2020

OTHER PUBLICATIONS

Boynapalli_English, boynapalli translation (Year: 2019).*
(Continued)

*Primary Examiner* — Minsun O Harvey
*Assistant Examiner* — Alexander Ehrlich
(74) *Attorney, Agent, or Firm* — Sughrue Mion, PLLC

(57) ABSTRACT

An integrated circuit including a plurality of stacked metal layers and a method of manufacturing the integrated circuit are provided. The method includes: providing a plurality of standard cells, each of which includes cell patterns respectively formed on the plurality of metal layers; and forming, on a particular metal layer among the plurality of metal layers which includes patterns extending in a first direction that are respectively formed on a plurality of tracks that are spaced apart from each other in a second direction, an additional pattern between adjacent patterns formed on a particular track of the plurality of tracks based on an interval between the adjacent patterns exceeding a reference value.

20 Claims, 15 Drawing Sheets

(51) Int. Cl.
*H10D 1/68* (2025.01)
*H10D 89/10* (2025.01)

(56) References Cited

U.S. PATENT DOCUMENTS

| | | | |
|---|---|---|---|
| 10,559,558 B2 | 2/2020 | Chang et al. | |
| 10,878,165 B2* | 12/2020 | Chang | G06F 30/392 |
| 2012/0288786 A1* | 11/2012 | Huang | G03F 1/38 430/315 |
| 2020/0134125 A1 | 4/2020 | Huang et al. | |
| 2020/0334407 A1 | 10/2020 | Kim et al. | |
| 2021/0104463 A1 | 4/2021 | Lee et al. | |
| 2021/0104508 A1 | 4/2021 | Lee et al. | |
| 2021/0167090 A1 | 6/2021 | Yu et al. | |

OTHER PUBLICATIONS

Communication issued Dec. 18, 2025 by the Korean Intellectual Property Office in Korean Patent Application No. 10-2022-0023831.

* cited by examiner

10
C1
C2
PL1
PL2
CH1
T1
TR11
TR12
TR13
TR14
TR15
A
A'
B
B'
<M1>
: Cell Pattern
: Extension Pattern
: Dummy Pattern
: Cell Boundary
X
Y
Z

FFC

R1

R2

TR11 TR12 TR13 TR14 TR15 TR16 TR17 TR18 TR19 TR10

INTEGRATED CIRCUIT AND METHOD OF MANUFACTURING THE SAME

CROSS-REFERENCE TO RELATED APPLICATIONS

This application claims priority to Korean Patent Application Nos. 10-2021-0155155, filed on Nov. 11, 2021, and 10-2022-0023831, filed on Feb. 23, 2022, in the Korean Intellectual Property Office, the disclosures of which are incorporated by reference herein in their entireties.

BACKGROUND

The present disclosure relates to an integrated circuit and a method of manufacturing the integrated circuit, and more particularly, to an integrated circuit including a plurality of metal layers, which are stacked, and a method of manufacturing the integrated circuit.

Integrated circuits may be designed based on standard cells. A layout of an integrated circuit may be generated by arranging the standard cells according to data defining the integrated circuit and routing the arranged standard cells. As a semiconductor manufacturing process is refined, the size of patterns in the standard cell may decrease, and the size of the standard cell may also decrease. As the gate length of a device and the pitch between gate lines in the integrated circuit continuously decrease, the density of lines for interconnecting the semiconductor devices has also increased.

SUMMARY

The present disclosure provides an integrated circuit having an increased degree of freedom of routing and a method of manufacturing the integrated circuit.

The issues to be solved by the technical idea of the present disclosure are not limited to the above-mentioned issues, and other issues not mentioned may be clearly understood by one of ordinary skill in the art from the following descriptions.

According to an aspect of an example embodiment, a method of manufacturing an integrated circuit including a plurality of metal layers, which are stacked, is provided. The method includes: providing a plurality of standard cells, each of which includes cell patterns respectively formed on the plurality of metal layers; and forming, on a particular metal layer among the plurality of metal layers which includes patterns extending in a first direction that are respectively formed on a plurality of tracks that are spaced apart from each other in a second direction, an additional pattern between adjacent patterns formed on a particular track of the plurality of tracks based on an interval between the adjacent patterns exceeding a reference value.

According to an aspect of an example embodiment, an integrated circuit including a plurality of metal layers, which are stacked, is provided. The integrated circuit includes: a first logic cell and a second logic cell, each including cell patterns respectively formed on the plurality of metal layers, wherein a particular metal layer among the plurality of metal layers includes patterns extending in a first direction and a plurality of first tracks spaced apart from each other in a second direction; and a dummy pattern formed on a particular track of the plurality of first tracks over the first logic cell and the second logic cell in the particular metal layer between adjacent patterns of the cell patterns, wherein the dummy pattern is electrically separated from other patterns on the particular metal layer. Patterns are respectively formed on each of the plurality of first tracks.

According to an aspect of an example embodiment, an integrated circuit including a plurality of metal layers, which are stacked, is provided. The integrated circuit includes: a first standard cell and a second standard cell, each including cell patterns respectively formed on the plurality of metal layers, wherein a particular metal layer among the plurality of metal layers includes patterns extending in a first direction and a plurality of first tracks spaced apart from each other in a second direction; and an extension pattern formed on a particular track of the plurality of first tracks over the first standard cell and the second standard cell in the particular metal layer between adjacent patterns of the cell patterns, wherein the extension pattern extends from a cell pattern of the first standard cell. The adjacent patterns are spaced apart from each other by at least one designated value.

BRIEF DESCRIPTION OF DRAWINGS

The drawings are not necessarily drawn to scale, and components may be exaggerated or reduced in size.

The above and other aspects and features will be more apparent from the following description of example embodiments taken in conjunction with the accompanying drawings in which.

DETAILED DESCRIPTION

Hereinafter, example embodiments are described in conjunction with the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described earlier than another step or operation, the step or operation may be performed later than the other step or operation unless the other step or operation is described as being performed after the step or operation.

Figure 1:
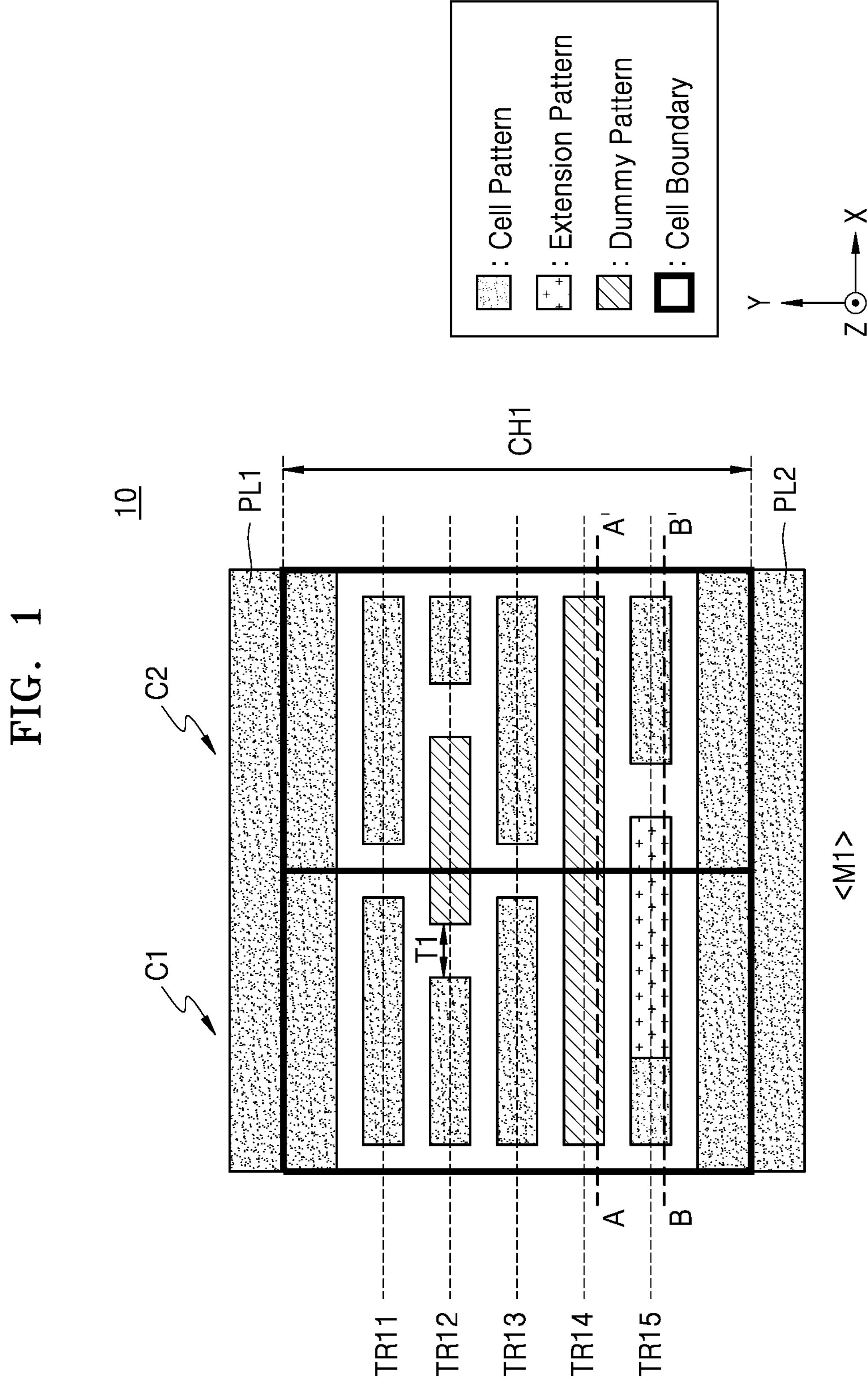
FIG. 1 is a layout diagram of an integrated circuit according to an example embodiment.

FIG. 1 is a layout diagram of an integrated circuit 10 according to an example embodiment. FIG. 1 is a layout diagram of patterns of a first metal layer M1 of the integrated circuit 10.

FIG. 1 is a plan view of portions of the integrated circuit 10 constituting one chip or one function block on a plane including an X-axis and a Y-axis. In the present disclosure, the X-axis direction and the Y-axis direction may be referred to as a first horizontal direction and a second horizontal direction, respectively, and a Z-axis direction may be referred to as a vertical direction. The plane formed by the X-axis and the Y-axis may be referred to as a horizontal plane, components placed in a +Z-axis direction relative to other components may be referred to as being above the other components, and components placed in a −Z-axis direction relative to other components may be referred to as being under the other components.

The integrated circuit 10 may include a plurality of standard cells. The standard cell may be a unit of a layout included in an integrated circuit, designed to perform a certain function, and referred to as a cell. The integrated circuits 10 may include a plurality of various standard cells, and the standard cells may be aligned along a plurality of rows.

The plurality of standard cells may be repeatedly used in an integrated circuit design. The standard cells may be pre-designed and stored in a standard cell library according to manufacturing techniques, and the integrated circuit may be designed by arranging and interconnecting the standard cells stored in the standard cell library according to design rules.

The standard cells may include logic cells. For example, a logic cell, such as an inverter, an AND gate, an OR gate, a XOR gate, and a NOR gate, may implement a circuit, which constitutes various basic circuits frequently used in digital circuit design for electronic devices, such as a central processing unit (CPU), a graphics processing unit (GPU), and a system-on-chip (SoC). Alternatively, for example, the logic cell may also implement other circuits frequently used in circuit blocks, such as a flip-flop and a latch.

The standard cells may include filler cells. A filler cell may be arranged adjacent to a functional cell, and may provide routing of signals, which are provided to the functional cell or received from the functional cell. In addition, the filler cell may include a cell used to fill the remaining space after the functional cells are arranged.

The integrated circuit 10 may include metal layers, in which wirings for interconnecting the standard cells are formed. Some of the metal layers may be used as components for interconnecting internal elements of the standard cell.

A plurality of metal layers may be sequentially stacked in a vertical direction, and for example, a second metal layer (for example, M2 in FIGS. 3 and 4) may be formed on the first metal layer M1, and a third metal layer (for example, M3 in FIG. 5) may be formed on the second metal layer M2. In an example embodiment, the first metal layer M1 may include patterns extending in the X-axis direction, the second metal layer M2 may include patterns extending in the Y-axis direction, and the third metal layer M3 may include patterns extending in the X-axis direction (uni-direction metal layer). In addition, other metal layers may be further formed on the third metal layer M3.

The patterns formed in each of the metal layers may include a metal, conductive metal nitride, metal silicide, or a combination thereof. In the drawings, only some layers may be illustrated for convenience of illustration, and a via under the pattern of the metal layer may be illustrated to indicate a connection between the pattern of the metal layer and a lower pattern, even though the via is under the pattern of the metal layer.

The integrated circuit 10 may include a first power line PL1 and a second power line PL2 (which may be referred to as power rails), which supply voltages to each of the standard cells. The first power line PL1 and the second power line PL2 may be arranged on a boundary of each of a plurality of rows. The first power line PL1 may provide a first supply voltage (for example, a power voltage) to each of the standard cells, and the second power line PL2 may provide a second supply voltage (for example, a ground voltage) to each of the standard cells. The first power line PL1 and the second power line PL2 may be formed by using a conductive pattern extending in the X-axis direction, and may be alternately arranged in the Y-axis direction. In FIG. 1, an example is illustrated, in which each of the first power line PL1 and the second power line PL2 is formed by a pattern of the first metal layer M1, but the integrated circuit according to the present disclosure is not limited thereto, and each of the first power line PL1 and the second power line PL2 may also be formed by using a pattern of a metal layer on the first metal layer M1 (e.g., power lines PL31 and PL32 of a third metal layer M3 in FIG. 5), or may also be formed inside a separation trench formed in a substrate.

Referring to FIG. 1, the integrated circuit 10 may include a first standard cell C1 and a second standard cell C2 arranged adjacent to each other in the X-axis direction. The first standard cell C1 and the second standard cell C2 may include a single height cell arranged in one row, and the first standard cell C1 and the second standard cell C2 may have a first cell height CH1 in the Y-axis direction. However, example embodiments are not limited thereto, and the integrated circuit 10 may also include a first standard cell C1 and a second standard cell C2 as multiple height cells continuously arranged in two or more adjacent rows to have a cell height that is greater than the first cell height CH1.

Each of the first standard cell C1 and the second standard cell C2 may be defined by a cell boundary. A diffusion break may be formed on the cell boundary. In this case, the first standard cell C1 and the second standard cell C2 may include logic cells.

A plurality of tracks, on which the patterns of the first metal layer M1 are arranged, may be defined in the integrated circuit 10. The first metal layer M1 may be a lowermost metal layer among the plurality of metal layers. The plurality of tracks may extend in the X-axis direction, and may be apart from each other in the Y-axis direction. For example, first through fifth tracks TR11 through TR15 may be formed on the first standard cell C1 and the second standard cell C2. A conductive pattern extending in the X-axis direction may be formed on the first through fifth tracks TR11 through TR15. However, example embodiments are not limited thereto and, for example, the number of tracks of the first metal layer M1 formed to pass through the cell boundary of the first standard cell C1 and the second standard cell C2 may be variously modified.

The first standard cell C1 and the second standard cell C2 may include the patterns of the first metal layer M1. For example, the first standard cell C1 may include cell patterns formed in the first track TR11, the second track TR12, the third track TR13, and the fifth track TR15. In addition, for example, the second standard cell C2 may include cell patterns formed on the first track TR11, the second track TR12, the third track TR13, and the fifth track TR15.

In each of the first standard cell C1 and the second standard cell C2, a cell pattern may not be formed on at least one of the first through fifth tracks TR11 through TR15. For example, at least one track among the first through fifth tracks TR11 through TR15 may not have a cell pattern formed inside a cell boundary of each of the first standard cell C1 and the second standard cell C2. For example, a cell pattern of the first standard cell C1 may not be formed on the fourth track TR14, and the cell pattern of the second standard cell C2 may not be formed on the fourth track TR14. The first standard cell C1 and the second standard cell C2 may not have a full-track structure.

The integrated circuit 10 may include a dummy pattern and/or an extension pattern formed on the first metal layer M1. The dummy pattern and the extension pattern may be arranged on the first standard cell C1 and the second standard cell C2, but may not be included in the cell pattern. The dummy pattern and the extension pattern may include patterns generated by a placement and routing (P&R) operation (for example, S20 in FIG. 6).

The patterns of the first metal layer M1 of the integrated circuit 10 may be arranged to have a designated interval with each other. An interval between patterns arranged adjacent to each other on the same track of the first metal layer M1 may be defined as a tip-to-tip (hereinafter, referred to as "T2T") space, and the patterns of the first metal layer M1 may be arranged so that the tip-to-tip space has a first designated value T1. For example, in the integrated circuit 10 constituting one chip or one function block, the number of the first designated value T1 may be set to 10 or less. In an example embodiment, the number of the first designated value T1 set in the integrated circuit 10 may be one or two.

In the method of manufacturing the integrated circuit 10, according to the example embodiments, by forming the dummy pattern and the extension pattern in an empty space of the first metal layer M1 in the P&R operation, the T2T space requirement of the first metal layer M1 may be satisfied. For example, the integrated circuit 10 may have a full-track structure, in which patterns satisfying the T2T space requirement are formed on all tracks of the first metal layer M1.

The dummy pattern of the first metal layer M1 may be electrically separated from patterns of other layers. For example, the dummy pattern may be electrically separated from the patterns of other metal layers formed on the first metal layer M1, and may be electrically separated from elements formed under the first metal layer M1.

In an example embodiment, the dummy pattern may be formed over the first standard cell C1 and the second standard cell C2. The dummy pattern of the first metal layer M1 may also be formed over two or more standard cells arranged adjacent to each other in the X-axis direction. For example, the dummy pattern may be arranged on the second track TR12 and the fourth track TR14, and may be arranged on the cell boundary between the first standard cell C1 and the second standard cell C2.

The extension pattern of the first metal layer M1 may be formed to extend from the cell pattern of the first standard cell C1. In an example embodiment, the extension pattern of the first metal layer M1 may include a pattern extending from an output pin or an input pin of the first standard cell C1. A via may be formed on the extension pattern, and may be electrically connected to an upper layer of the first metal layer M1, for example, the second metal layer M2. In addition, the extension pattern may be electrically connected to elements formed under the first metal layer M1.

In an example embodiment, the extension pattern may be formed over the first standard cell C1 and the second standard cell C2. The extension pattern of the first metal layer M1 may also be formed over two or more standard cells arranged adjacent to each other in the X-axis direction. For example, the extension pattern may be arranged on the fifth track TR15.

The integrated circuit 10 according to an example embodiment may include the first standard cell C1 and the second standard cell C2, in which empty tracks for which the cell patterns are not formed in the first metal layer M1 are arranged. For example, the empty tracks may include the dummy pattern or the extension pattern, which are additional patterns additionally formed in the P&R operation. Accordingly, when the integrated circuit 10 is manufactured, the degree of freedom of routing may be increased, and it may be easy to form certain patterns on the first metal layer M1 having the full-track structure.

Figure 2A:
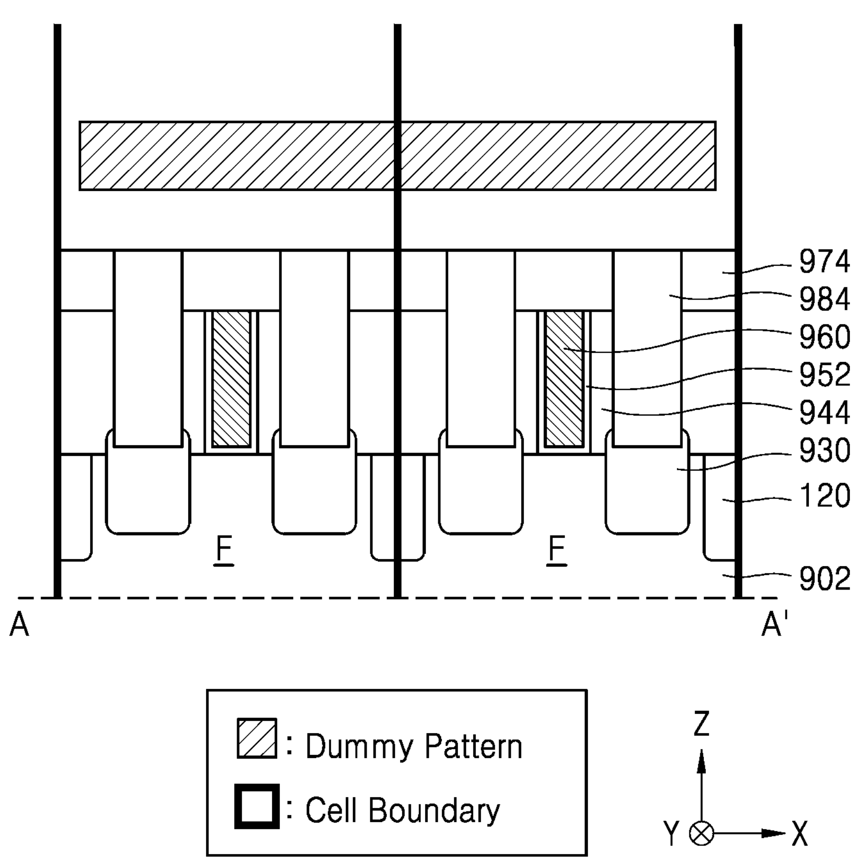
FIGS. 2A and 2C are cross-sectional views taken along line A-A' in FIG. 1, and FIGS. 2B and 2D are cross-sectional views taken along line B-B' in FIG. 1.
Figure 2B:
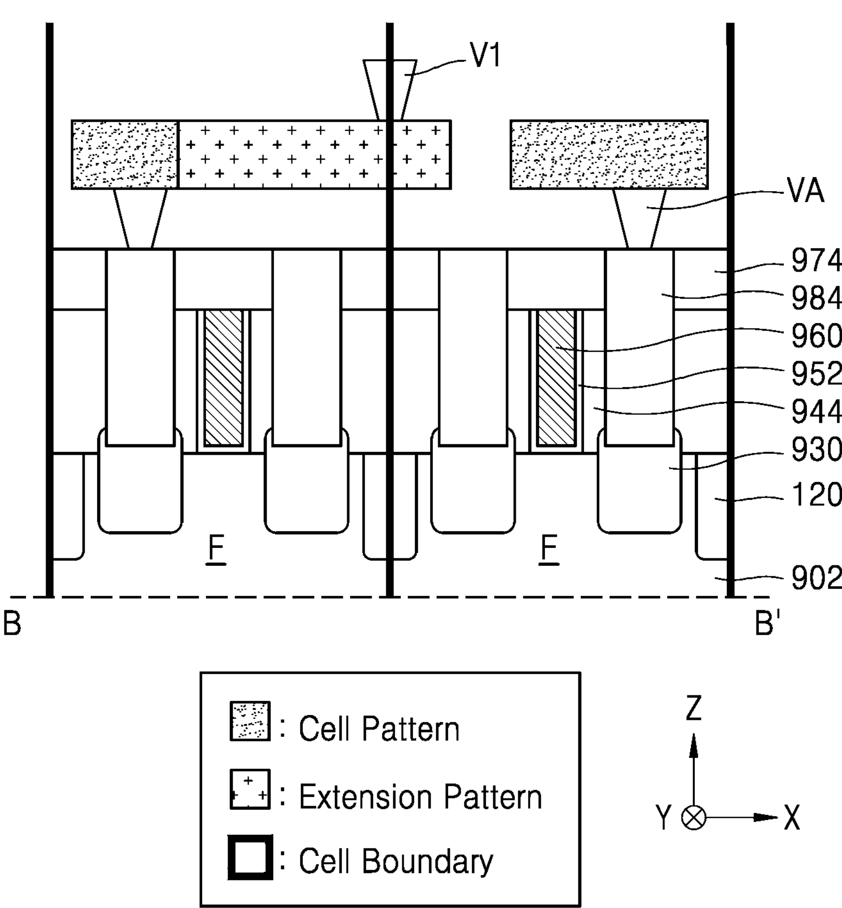
Figure 2C:
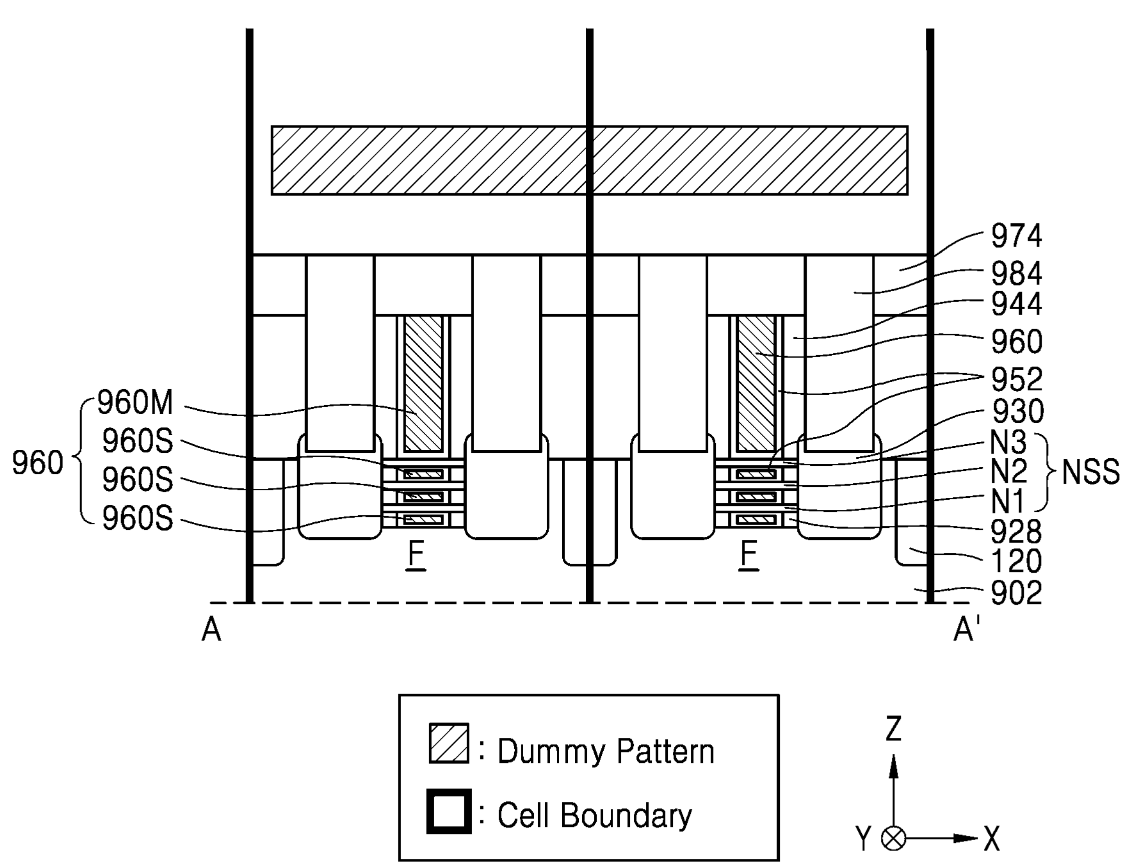
Figure 2D:
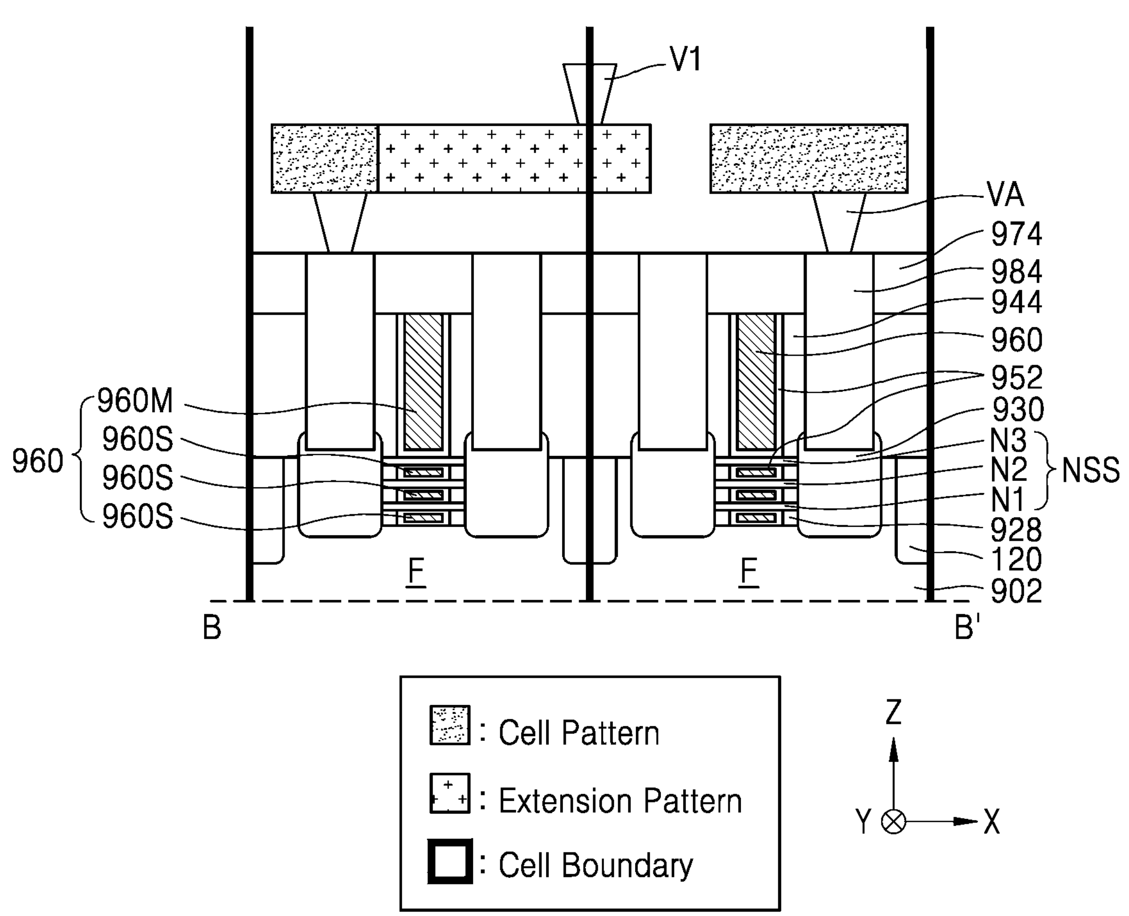

FIGS. 2A and 2C are cross-sectional views taken along line A-A' in FIG. 1, and FIGS. 2B and 2D are cross-sectional views taken along line B-B' in FIG. 1. In the description with reference to FIGS. 2C and 2D, duplicate descriptions of the same reference numerals as in FIGS. 2A and 2B are omitted.

Referring to FIGS. 1, 2A, and 2B, each of the first standard cell C1 and the second standard cell C2 of the integrated circuit 10 may be defined by the cell boundary, and a diffusion break 120 may be formed on each cell boundary. The diffusion break 120 may electrically separate active regions of different standard cells from each other. Although a single diffusion break is illustrated in FIGS. 2A and 2B, example embodiments are not limited thereto and, for example, a double diffusion break may be formed on the cell boundary.

The diffusion break 120 may include a silicon-included insulating layer, such as a silicon oxide layer, a silicon nitride layer, a silicon oxynitride layer, and a silicon carbide layer, or a combination thereof. For example, the diffusion break 120 may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ).

Each of the first standard cell C1 and the second standard cell C2 of the integrated circuit 10 may include a fin-type active region F protruding from a substrate 902 and extending in the X-axis direction. The substrate 902 may include a semiconductor, such as silicon (Si) and germanium (Ge), or a III-V Group compound, such as GaAs, AlGaAs, InAs, InGaAs, InSb, GaSb, InGaSb, InP, GaP, InGaP, InN, GaN, and InGaN. In an example embodiment, the substrate 902 may include a silicon-on-insulator (SOI) substrate, or a germanium-on-insulator (GOI) substrate.

The number of fin-type active regions F formed in each of the first standard cell C1 and the second standard cell C2 may be variously modified. However, each of the first standard cell C1 and the second standard cell C2 according to example embodiments are not limited to those illustrated in FIGS. 2A and 2B, and a nanosheet may also be formed on the fin-type active region F, for example, a multi bridge channel (MBC) field effect transistor (FET), in which a gate line surrounds the nanosheet, may also be formed. Alternatively, for example, a gate-all-round (GAA) FET, in which nanowires are surrounded by a gate line, may also be formed on the fin-type active region F, or a vertical GAA FET, in which a plurality of stacked nanowires are surrounded by the gate line, may also be formed. In addition, for example, a negative capacitance (NC) FET may also be formed in an active region of each of the first standard cell C1 and the second standard cell C2. In addition to the above-described examples, other various transistors, such as a complementary FET (CFET), a negative CFET (NCFET), a carbon nanotube (CNT) FET (CNT FET), a bipolar junction transistor, and other three-dimensional transistors, may be formed.

A gate line 960 may be formed to extend in the Y-axis direction on the fin-type active region F. The gate line 960 may include a metal, a metal nitride, metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC. A gate insulating layer 952 may be arranged to surround the gate line 960. The gate insulating layer 952 may include an interface layer and a high dielectric layer. The interface layer may include a silicon oxide layer, a silicon oxynitride layer, a silicate layer, or a combination thereof.

A plurality of source/drain regions 930 may be formed on the fin-type active region F. The plurality of source/drain regions 930 may include epitaxially grown semiconductor layers. For example, the plurality of source/drain regions 930 may include semiconductor layers epitaxially grown from the fin-type active region F. The plurality of source/drain regions 930 may have an embedded SiGe structure including an epitaxially grown Si layer, an epitaxially grown SiC layer, a plurality of epitaxially grown SiGe layers, etc. A metal silicide layer may be formed on an upper surface of each of a plurality of source/drain regions 930.

A plurality of contact plugs 984 may be respectively connected to a plurality of source/drain regions 930. The plurality of contact plugs 984 may be respectively arranged in a plurality of contact holes penetrating an interlayer insulating layer 974 and an inter-gate insulating layer 944. Each of the plurality of contact plugs 984 may include a metal, conductive metal nitride, or a combination thereof. For example, a plurality of contact plugs 984 may include W, Cu, Al, Ti, Ta, TiN, TaN, an alloy thereof, or a combination thereof.

As illustrated in FIG. 2A, the dummy pattern formed on the first metal layer M1 may be electrically separated from patterns of the upper and lower layers thereof. The dummy pattern may not be connected to (i.e., may be isolated from) both the gate line 960 and a plurality of source/drain regions 930 of the first standard cell C1 and the second standard cell C2. In an example embodiment, the length of the dummy pattern extending from the cell boundary into the first standard cell C1 or the second standard cell C2 may be greater than the distance between the gate line 960 and the diffusion break 120 or the distance between adjacent gate lines 960.

As illustrated in FIG. 2B, the extension pattern formed on the first metal layer M1 may extend from the cell pattern. In an example embodiment, the extension pattern may be electrically connected to a pattern of an upper layer, for example, the second metal layer M2, through a via V1. In the P&R operation, the extension pattern may be formed, and at the same time, a pattern of the via V1 and the upper layer contacting the extension pattern on the extension pattern may be formed. In addition, in an example embodiment, the extension pattern may be electrically connected to at least one of the first standard cell C1 and the second standard cell C2, for example, the gate line 960 of the first standard cell C1 and a contact plug 984. For example, the extension pattern may be electrically connected to the contact plug 984 through a via VA formed under the cell pattern.

Referring to FIGS. 1, 2C, and 2D, the first standard cell C1 and the second standard cell C2 of the integrated circuit 10 may include a plurality of fin-type active regions F protruding from a substrate 902, and a plurality of nanosheet stacks NSS facing the upper surface of the plurality of fin-type active regions F at positions spaced apart from the plurality of fin-type active regions F in the Z-axis direction. The term "nanosheet" used in the present disclosure may refer to a conductive structure having a cross-section substantially vertical to a direction in which a current flows. The nanosheet should be understood to include nanowires.

Each of the plurality of nanosheet stacks NSS may include a plurality of nanosheets N1, N2, and N3 overlapping each other in the Z-axis direction on the upper surface of the fin-type active region F. In FIGS. 2C and 2D, the case where a cross-sectional shape of the nanosheet stack NSS is a substantially rectangular shape is illustrated, but example embodiments are not limited thereto.

In FIGS. 2C and 2D, the case where each of the plurality of nanosheet stacks NSS includes three nanosheets is illustrated, but example embodiments are not limited thereto. For example, the nanosheet stack NSS may include two nanosheets, or more than three nanosheets, and the number of nanosheets constituting the nanosheet stack NSS is not particularly limited.

Each of the plurality of nanosheets N1, N2, and N3 may have a channel region. In example embodiments, the plurality of nanosheets N1, N2, and N3 may have substantially the same thickness. In other example embodiments, at least some of the plurality of nanosheets N1, N2, and N3 may have different thicknesses from each other.

In example embodiments, the plurality of nanosheets N1, N2, and N3 may include semiconductor layers including the same element. In one example, each of the plurality of nanosheets N1, N2, and N3 may include an Si layer. In another example, each of the plurality of nanosheets N1, N2, and N3 may include an SiGe layer. In other example embodiments, the plurality of nanosheets N1, N2, and N3 may include semiconductor layers including different elements from each other. For example, the first nanosheet N1 may include a SiGe layer, and the second and third nanosheets N2 and N3 may include a Si layer.

The gate line 960 may be provided around each of the plurality of nanosheets N1, N2, and N3 and cover the nanosheet stack NSS in the fin-type active region F. Each of the plurality of gate lines 960 may include a main gate portion 960M, which covers the upper surface of the nanosheet stack NSS and extends in the Y-axis direction, and a plurality of sub-gate portions 960S, which are integrally connected to the main gate portion 960M and respectively arranged between each of the plurality of nanosheets N1, N2, and N3, and between the fin-type active region F and the first nanosheet N1. The plurality of nanosheets N1, N2, and N3 may have a gate-all-around (GAA) structure, in which they are completely surrounded by the gate line 960.

A plurality of inner insulating spacers 928 may be respectively arranged between the nanosheets N1 and N2, and the nanosheets N2 and N3, and between the fin-type active region F and the first nanosheet N1. Both sidewalls of each of the plurality of sub-gate portions 960S may be covered by the inner insulating spacer 928 with the gate insulating layer 952 therebetween.

Figure 3:
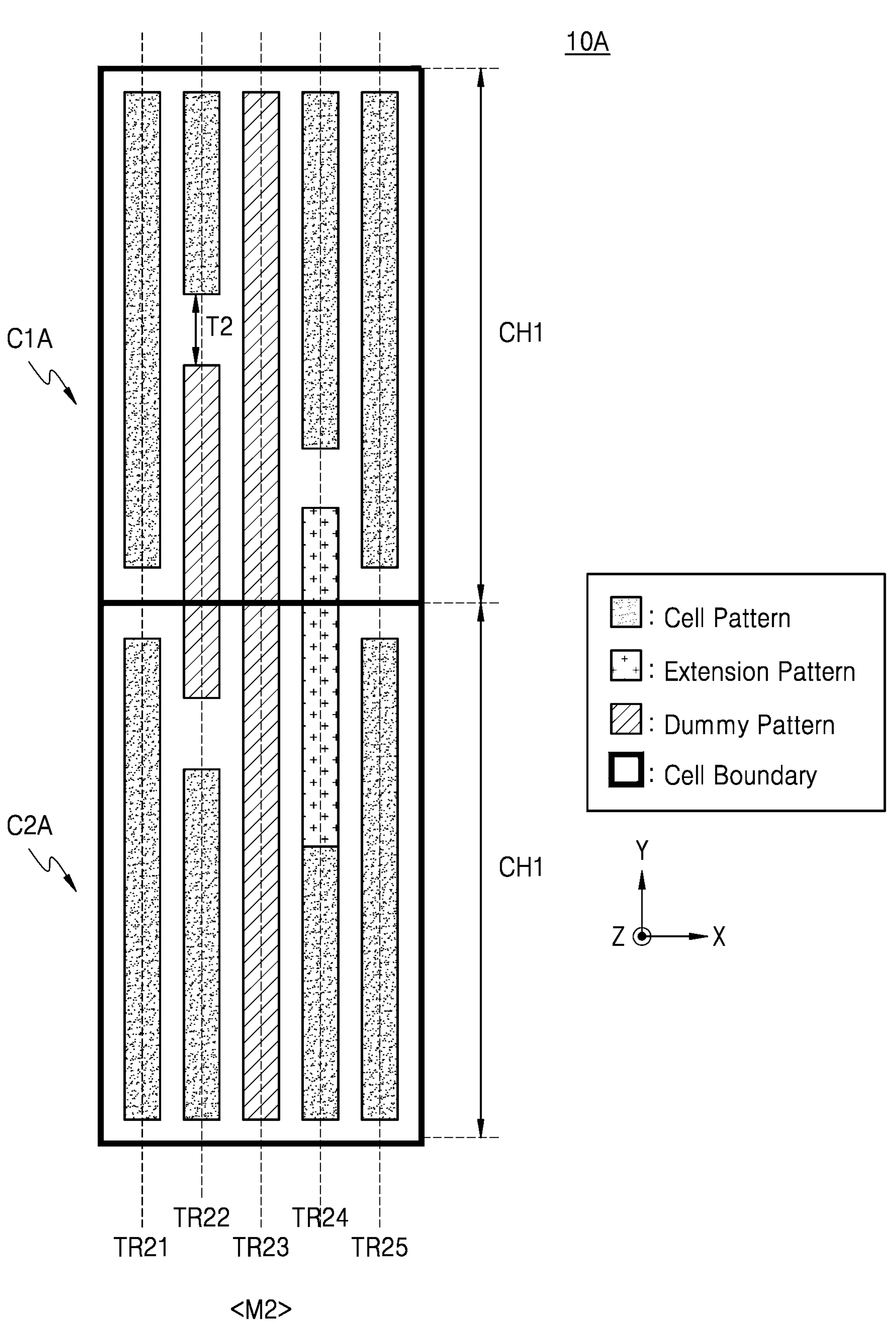
FIGS. 3 and 4 are diagrams of integrated circuits according to example embodiments.
Figure 4:
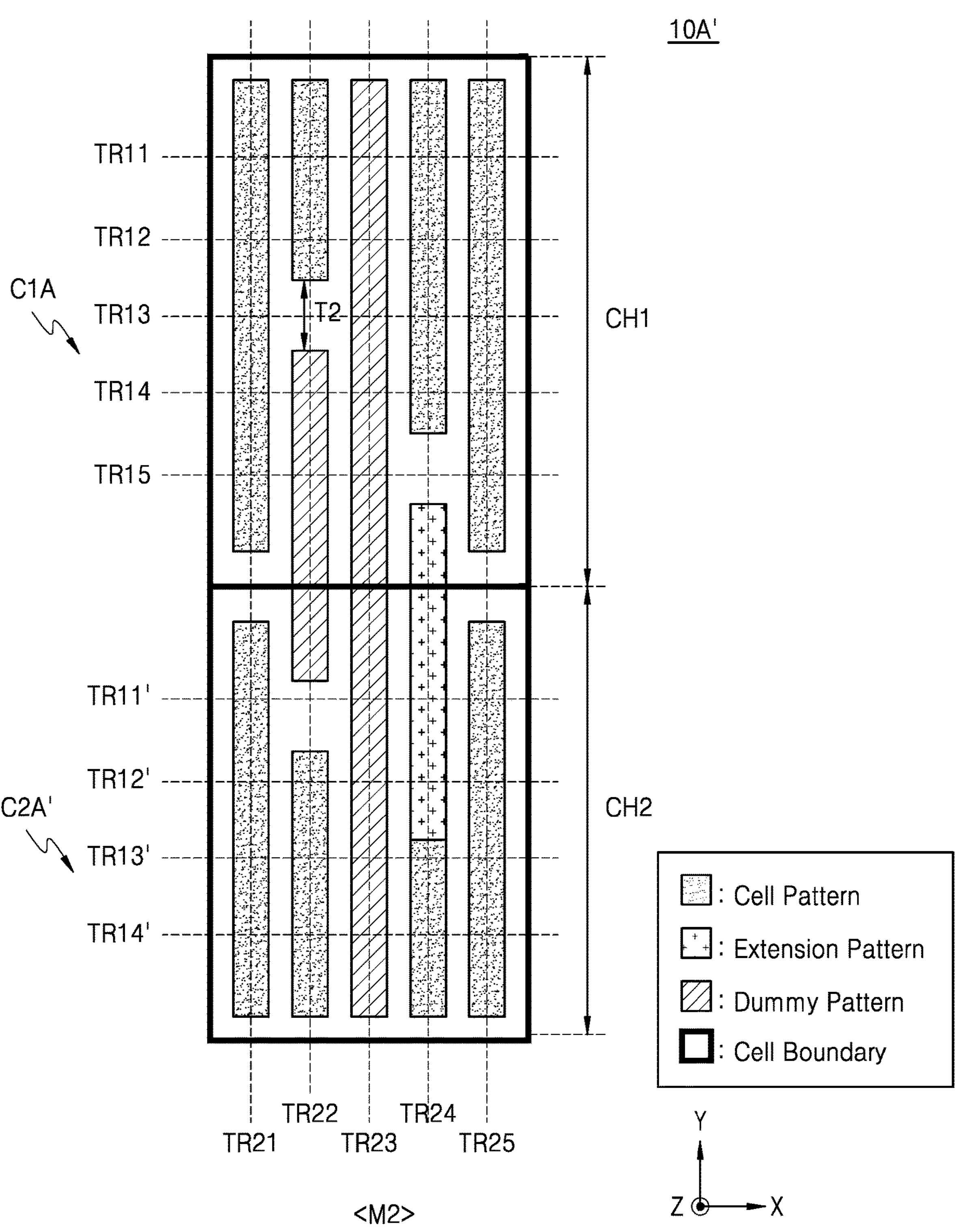

FIGS. 3 and 4 are diagrams of integrated circuits 10A and 10A' according to example embodiments. FIGS. 3 and 4 are layout diagrams for describing patterns of the second metal layer M2 of the integrated circuits 10A and 10A'.

Referring to FIG. 3, the integrated circuit 10A may include a first standard cell C1A and a second standard cell C2A, which are arranged adjacent to each other in the Y-axis direction. Each of the first standard cell C1A and the second standard cell C2A may include a single height cell arranged in one row, and each of the first standard cell C1A and the second standard cell C2A may have the first cell height CH1 in the Y-axis direction. However, example embodiments are not limited thereto, and the integrated circuit 10A may also include the first standard cell C1A and the second standard cell C2A as multiple height cells continuously arranged on two or more adjacent rows to have a cell height that is greater than the first cell height CH1.

Each of the first standard cell C1A and the second standard cell C2A may be defined by the cell boundary. The first standard cell C1A and the second standard cell C2A may include logic cells.

A plurality of tracks, on which the patterns of the second metal layer M2 are arranged, may be defined in the integrated circuit 10A. In this case, the second metal layer M2 may be formed on the first metal layer (M1 in FIG. 1), and may be a second closest metal layer from the substrate among the plurality of metal layers.

A plurality of tracks of the second metal layer M2 may extend in the Y-axis direction, and may be apart from each other in the X-axis direction. For example, first through fifth tracks TR21 through TR25 may be formed on the first standard cell C1A and the second standard cell C2A. A conductive pattern extending in the Y-axis direction may be formed on the first through fifth tracks TR21 through TR25. However, example embodiments are not limited thereto and, for example, the number of tracks of the second metal layer M2 formed to pass through the cell boundary of the first standard cell C1A and the second standard cell C2A may be variously modified.

The first standard cell C1A and the second standard cell C2A may include the cell patterns of the second metal layer M2. For example, the first standard cell C1A may include cell patterns respectively formed on the first track TR21, the second track TR22, the fourth track TR24, and the fifth track TR25. In addition, the second standard cell C2A may include the cell patterns respectively formed on the first track TR21, the second track TR22, the fourth track TR24, and the fifth track TR25.

In each of the first standard cell C1A and the second standard cell C2A, the cell pattern may not be formed on at least one of the first through fifth tracks TR21 through TR25. For example, at least one track among the first through fifth tracks TR21 through TR25 may not have the cell pattern formed inside the cell boundary of each of the first standard cell C1A and the second standard cell C2A. For example, the cell pattern of the first standard cell C1A may not be formed on the third track TR23, and the cell pattern of the second standard cell C2A may not be formed on the third track TR23. The first standard cell C1A and the second standard cell C2A may not have a full-track structure.

The integrated circuit 10A may include the dummy pattern and/or the extension pattern formed on the second metal layer M2. The dummy pattern and the extension pattern may be arranged on the first standard cell C1A and the second standard cell C2A, but may not be on the cell pattern (e.g., not be included in the cell pattern). The dummy pattern and the extension pattern may include patterns generated by the P&R operation (for example, S20 in FIG. 6).

The patterns of the second metal layer M2 of the integrated circuit 10A may be arranged to have a designated interval with each other. An interval between patterns arranged adjacent to each other on the same track of the second metal layer M2 may be defined as a T2T space, and the patterns of the second metal layer M2 may be arranged so that the T2T space has a second designated value T2. For example, in the integrated circuit 10A constituting one chip or one function block, the number of the second designated value T2 may be set to 10 or less. In an example embodiment, the number of the second designated value T2 set in the integrated circuit 10A may be one or two.

In the method of manufacturing the integrated circuit 10, according to example embodiments, by forming the dummy pattern and the extension pattern in an empty space of the second metal layer M2 in the P&R operation, the T2T space requirement of the second metal layer M2 may be satisfied. For example, the integrated circuit 10A may have a full-track structure, in which patterns satisfying the T2T space requirement are formed on all tracks of the second metal layer M2.

The dummy pattern of the second metal layer M2 may be electrically separated from patterns of other layers. For example, the dummy pattern may be electrically separated from the patterns of other metal layers formed on the second metal layer M2, and may be electrically separated from patterns of the first metal layer M1.

In an example embodiment, the dummy pattern may be formed over the first standard cell C1A and the second standard cell C2A. The dummy pattern of the second metal layer M2 may also be formed over two or more standard cells arranged adjacent to each other in the Y-axis direction. For example, the dummy pattern may be arranged on the second track TR22 and the third track TR23, and may be arranged on the cell boundary between the first standard cell C1A and the second standard cell C2A.

The extension pattern of the second metal layer M2 may be formed to extend from the cell pattern of the second standard cell C2A. In an example embodiment, the extension pattern of the second metal layer M2 may include a pattern extending from an output pin or an input pin of the second standard cell C2A. A via may be formed on the extension pattern, and may be electrically connected to an upper layer of the second metal layer M2, for example, the third metal layer (for example, M3 in FIG. 5). In addition, the extension pattern may also be electrically connected to the first metal layer M1 through the via.

In an example embodiment, the extension pattern may be formed over the first standard cell C1A and the second standard cell C2A. The extension pattern of the second metal layer M2 may also be formed over two or more standard cells arranged adjacent to each other in the Y-axis direction. For example, the extension pattern may be arranged on the fourth track TR24, and may be arranged on the cell boundary between the first standard cell C1A and the second standard cell C2A.

Referring to FIG. 4 in comparison with FIG. 3, the integrated circuit 10A' may include the first standard cell C1A and a second standard cell C2A', which are arranged adjacent to each other in the Y-axis direction. In this case, the first standard cell C1A may have the first cell height CH1, and the second standard cell C2A' may have a second cell height CH2, that is different from the first cell height CH1.

In an example embodiment, the second cell height CH2 may be less than the first cell height CH1. The number of tracks of the first metal layer M1 formed on the second standard cell C2A' may be less than the number of tracks of the first metal layer M1 formed on the first standard cell C1A. For example, the first standard cell C1A may be formed on the five tracks of the first metal layer M1, that is, the first through fifth tracks TR11 through TR15, and the second standard cell C2A' may be formed on the four tracks of the first metal layer M1, that is, first through fourth tracks TR11' through TR14'.

The integrated circuits 10A and 10A' according to example embodiments may include the first standard cell C1A and the second standard cells C2A and C2A', where empty tracks for which the cell patterns are not formed on the second metal layer M2 are arranged. For example, the empty tracks may include the dummy pattern or the extension pattern, which are additional patterns additionally formed in the P&R operation. Accordingly, when the integrated circuits 10A and 10A' are manufactured, the degree of freedom of routing may be increased, and it may be easy to form certain patterns on the second metal layer M2 having the full-track structure.

Figure 5:
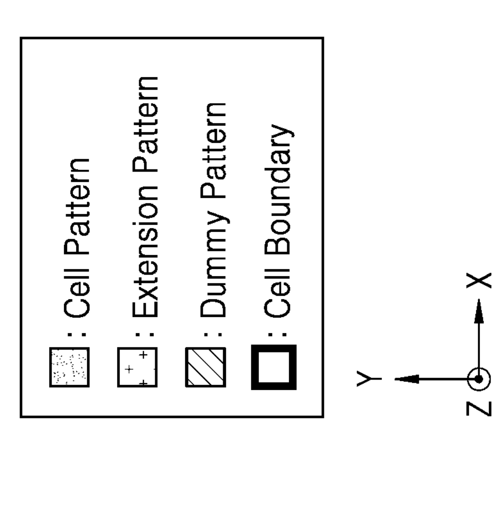
FIG. 5 is a diagram of an integrated circuit according to an example embodiment.

FIG. 5 is a diagram of an integrated circuit 10B according to an example embodiment. FIG. 5 is a layout diagram of patterns of a third metal layer M3 of the integrated circuit 10B.

Referring to FIG. 5, the integrated circuit 10B may include a first standard cell C1B and a second standard cell C2B arranged adjacent to each other in the X-axis direction. Each of the first standard cell C1B and the second standard cell C2B may include a single height cell arranged in one row, and each of the first standard cell C1B and the second standard cell C2B may have the first cell height CH1 in the Y-axis direction. However, example embodiments are not limited thereto, and the integrated circuit 10B may also include the first standard cell C1B and the second standard cell C2B as multiple height cells continuously arranged on two or more adjacent rows.

Each of the first standard cell C1B and the second standard cell C2B may be defined by the cell boundary. The first standard cell C1B and the second standard cell C2B may include logic cells.

A plurality of tracks, on which the patterns of the third metal layer M3 are arranged, may be defined in the integrated circuit 10B. In this case, the third metal layer M3 may include a metal layer third closest to the substrate among the plurality of metal layers. For example, the first metal layer M1 and the second metal layer M2 may be provided between the third metal layer M3 and the substrate.

A plurality of tracks of the third metal layer M3 may extend in the X-axis direction, and may be apart from each other in the Y-axis direction. For example, first through fifth tracks TR31 through TR35 may be formed on the first standard cell C1B and the second standard cell C2B. A conductive pattern extending in the X-axis direction may be formed on the first through fifth tracks TR31 through TR35. However, example embodiments are not limited thereto and, for example, the number of tracks of the third metal layer M3 formed to pass through the cell boundary of the first standard cell C1B and the second standard cell C2B may be variously modified.

The first standard cell C1B and the second standard cell C2B may include the patterns of the third metal layer M3. For example, the first standard cell C1B may include cell patterns formed on the first track TR31, the third track TR33, the fourth track TR34, and the fifth track TR35. In addition, for example, the second standard cell C2B may include cell patterns formed on the first track TR31, the third track TR33, the fourth track TR34, and the fifth track TR35.

In each of the first standard cell C1B and the second standard cell C2B, the cell pattern may not be formed on at least one of the first through fifth tracks TR31 through TR35. For example, at least one track among the first through fifth tracks TR31 through TR35 may not have the cell pattern formed inside the cell boundary of each of the first standard cell C1B and the second standard cell C2B. For example, the cell pattern of the first standard cell C1B may not be formed on the second track TR32, and the cell pattern of the second standard cell C2B may not be formed on the second track TR32. The first standard cell C1B and the second standard cell C2B may not have a full-track structure.

The integrated circuit 10B may include the dummy pattern and/or the extension pattern formed on the third metal layer M3. The dummy pattern and the extension pattern may be arranged on the first standard cell C1B and the second standard cell C2B, but may not be included in the cell pattern. The dummy pattern and the extension pattern may include patterns generated by the P&R operation (for example, S20 in FIG. 6).

The patterns of the third metal layer M3 of the integrated circuit 10B may be arranged to have a designated interval with each other. An interval between patterns arranged adjacent to each other on the same track of the third metal layer M3 may be defined as a T2T space, and the patterns of the third metal layer M3 may be arranged so that the T2T space has a third designated value T3. For example, in the integrated circuit 10B constituting one chip or one function block, the number of the third designated value T3 may be set to 10 or less. In an example embodiment, the number of the third designated value T3 set in the integrated circuit 10B may be one or two.

In the method of manufacturing the integrated circuit 10B, according to example embodiments, by forming the dummy pattern and the extension pattern in an empty space of the third metal layer M3 in the P&R operation, the T2T space requirement of the third metal layer M3 may be satisfied. For example, the integrated circuit 10B may have a full-track structure, in which patterns satisfying the T2T space requirement are formed on all tracks of the third metal layer M3.

The dummy pattern of the third metal layer M3 may be electrically separated from patterns of other layers. For example, the dummy pattern may be electrically separated from the patterns of other metal layers formed on the third metal layer M3, and may be electrically separated from the patterns of the first metal layer M1 and the second metal layer M2.

In an example embodiment, the dummy pattern may be formed over the first standard cell C1B and the second standard cell C2B. The dummy pattern of the third metal layer M3 may also be formed over two or more standard cells arranged adjacent to each other in the X-axis direction. For example, the dummy pattern may be arranged on the first track TR31 and the second track TR32, and may be arranged on the cell boundary between the first standard cell C1B and the second standard cell C2B.

The extension pattern of the third metal layer M3 may be formed to extend from the cell pattern of the first standard cell C1B. In an example embodiment, the extension pattern of the third metal layer M3 may include a pattern extending from an output pin or an input pin of the first standard cell C1B. A via may be formed on the extension pattern, and may be electrically connected to an upper layer of the third metal layer M3. In addition, the extension pattern may also be electrically connected to the first metal layer M1 or the second metal layer M2.

In an example embodiment, the extension pattern may be formed over the first standard cell C1B and the second standard cell C2B. The extension pattern of the third metal layer M3 may also be formed over two or more standard cells arranged adjacent to each other in the X-axis direction. For example, the extension pattern may be arranged on the fifth track TR35, and may be arranged on the cell boundary between the first standard cell C1B and the second standard cell C2B.

The integrated circuit 10B according to an example embodiment may include the first standard cell C1B and the second standard cell C2B, in which empty tracks for which the cell patterns are not formed in the third metal layer M3 are arranged. For example, the empty tracks may include the dummy pattern or the extension pattern, which are additional patterns additionally formed in the P&R operation. Accordingly, when the integrated circuit 10B is manufactured, the degree of freedom of routing may be increased, and it may be easy to form certain patterns on the third metal layer M3 having the full-track structure.

Figure 6:
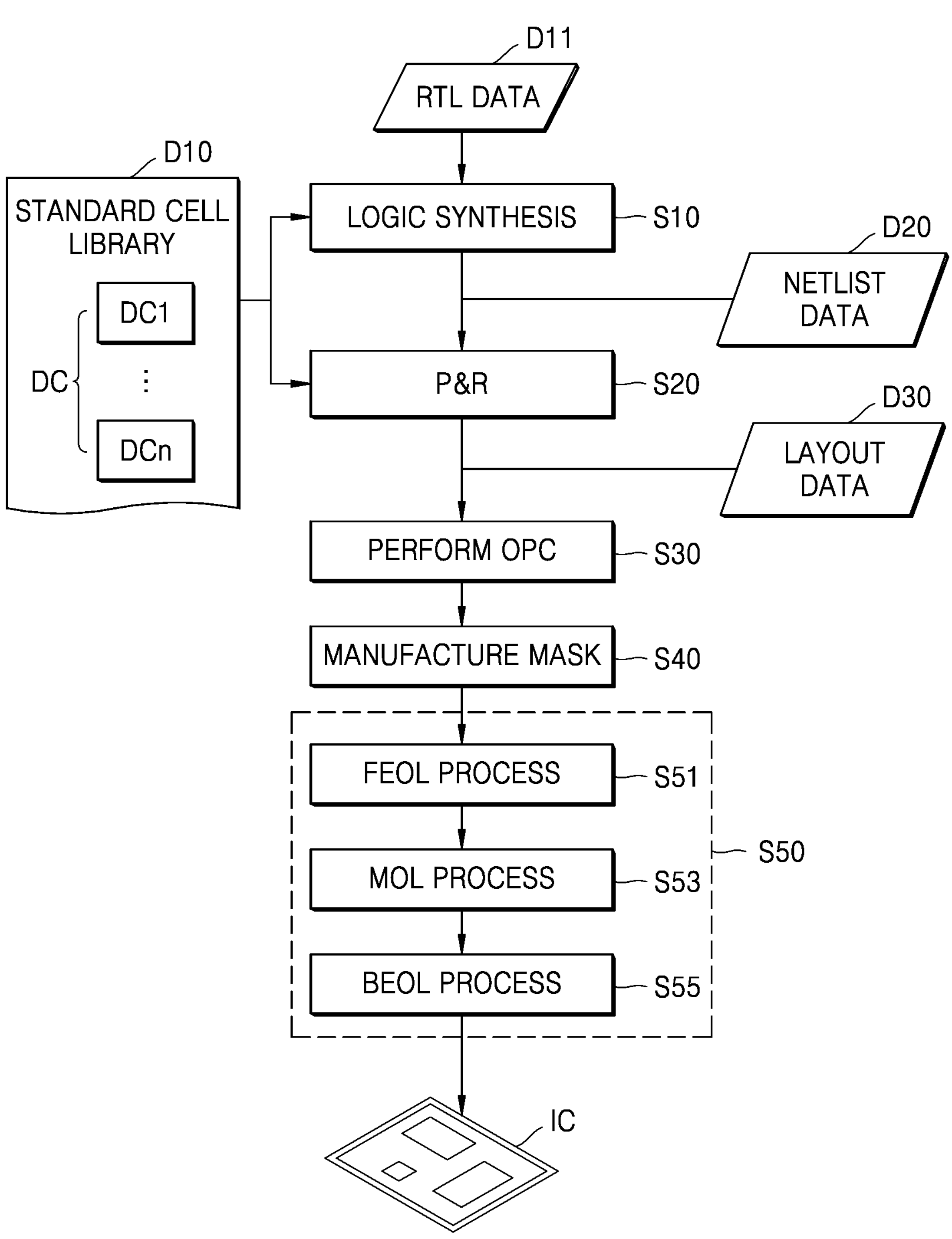
FIG. 6 is a flowchart of a method of manufacturing an integrated circuit, according to an example embodiment.

FIG. 6 is a flowchart of a method of manufacturing an integrated circuit IC, according to an example embodiment.

Referring to FIG. 6, a standard cell library D10 may include information about cells, for example, function information, characteristic information, layout information, etc. The standard cell library D10 may include data DC defining a layout of a standard cell. The data DC may include data which performs an identical function, and defines a structure of standard cells having different layouts. The data DC may include data defining structures of the standard cells C1, C1A, C1B, C2, C2A, and C2B described with reference to FIGS. 1 through 5, or a standard cell FFC to be described with reference to FIG. 9. The data DC may include a first piece of data DC1, which performs a first function and defines a structure of standard cells having different layouts, to an $n^{th}$ piece of data DCn (n is a natural number equal to or greater than two), which performs an $n^{th}$ function and defines a structure of standard cells having different layouts.

Operations S10 and S20 may be operations for designing the integrated circuit IC, and may generate layout data D30 from register transfer level (RTL) data D11. The integrated circuit IC may include at least one of the integrated circuits 10, 10A, and 10B of FIGS. 1 through 5 and an integrated circuit 10C of FIG. 10. A logic synthesis operation of generating netlist data D20 from the RTL data D11 may be performed (S10). For example, a semiconductor design tool (for example, a logic synthesis module) may generate the netlist data D20 including a bitstream or a netlist, by performing logic synthesis by referring to the standard cell library D10 from the RTL data D11, which is prepared in hardware description language (HDL), such as very-high-speed integrated circuits (VHSIC) HDL (VHDL) and Verilog. The standard cell library D10 may include the data DC, which performs an identical function, and defines a structure of standard cells having different layouts, and the standard cells may be included in the integrated circuit IC by referring to such information in a logic synthesis process.

The P&R operation generating layout data D30 from the netlist data D20 may be performed (S20). The layout data D30 may have a format of, for example, graphic database system information interchange (GDSII), and may include geometric information about the standard cells and the interconnections. In an example embodiment, operation S20 may include operations S21 through S23 in FIG. 7, and may include operations S231 and S232 in FIG. 8.

In operation S20, the semiconductor design tool (for example, the P&R module) may place a plurality of standard cells by referring to the standard cell library D10 from the netlist data D20. The semiconductor design tool may, by referring to the data DC, select one of the layouts of the standard cell defined by the netlist data D20, and place the selected layout of the standard cell.

In addition, in operation S20, the semiconductor design tool may perform a placement and routing (P&R) operation, which is an operation of generating interconnections. "Routing" may be an operation of arranging wiring layers and vias required to properly connect the arranged standard cells according to the design rules for an integrated circuit. The interconnections may electrically connect the output pins of the standard cell to the input pins of the standard cell and may include, for example, a conductive pattern formed on at least one via and at least one metal layer. Patterns formed in the metal layers at different levels may be electrically connected to each other through vias including conductive materials. In this case, the metal layer may include a metal as a conductive material.

Optical proximity correction (OPC) may be performed (S30). The OPC may be refer to as an operation of forming a pattern in a desired shape by correcting distortion, such as refraction caused by characteristics of light in photolithography included in a semiconductor process for manufacturing the integrated circuit IC, and the pattern on a mask may be determined by applying the OPC to the layout data D30. In some example embodiments, the layout of the integrated circuit IC may be limitedly modified in operation S30, and the limited modification of the integrated circuit IC in operation S30 may be a post process for optimizing the structure of the integrated circuit IC, which may be referred to as design polishing.

An operation of manufacturing a mask may be performed (S40). For example, as the OPC is applied to the layout data D30, patterns on the mask may be defined to form patterns formed on a plurality of layers, and at least one mask (or, photomask) for forming the pattern of each of the plurality of layers may be manufactured.

An operation of fabricating the integrated circuit IC may be performed (S50). For example, the integrated circuit IC may be fabricated by patterning the plurality of layers by using at least one mask manufactured in operation S40. Operation S50 may include operations S51, S53, and S55, and may include a deposition process, an etching process, an ionization process, a cleaning process, etc. In addition, operation S50 may include a packaging process for mounting the semiconductor elements on a printed circuit board (PCB) and sealing the semiconductor elements with a sealing material, and may also include a test process for testing the semiconductor elements or the package.

The operation of fabricating the integrated circuit IC may include a front-end-of-line (FEOL) process (S51). The FEOL process may include a process of forming individual devices, such as transistors, capacitors, and resistors, on a substrate in the manufacturing process of the integrated circuit IC. For example, the FEOL process may include planarizing and cleaning a wafer, forming a trench, forming a well, forming a gate line, forming source and drain regions, etc.

The operation of fabricating the integrated circuit IC may include a middle-end-of-line (MOL) process (S53). The MOL process may include a process of forming a connection member for connecting individual elements generated by using the FEOL process within a standard cell. For example, the MOL process may include forming an active contact in an active region, forming a gate contact on a gate line, forming an active contact and a via on the gate line, etc.

The operation of fabricating the integrated circuit IC may include a back-end-of-line (BEOL) process (S55). The BEOL process may include a process of interconnecting individual elements, such as transistors, capacitors, and resistors, in the manufacturing process of the integrated circuit IC. For example, the BEOL process may include silicidating gate, source, and drain regions, adding a dielectric, planarizing, forming holes, forming metal layers, forming vias between the metal layers, forming passivation layers, etc. Next, the integrated circuit IC may be packaged in a semiconductor package, and used as a component of various applications.

Figure 7:
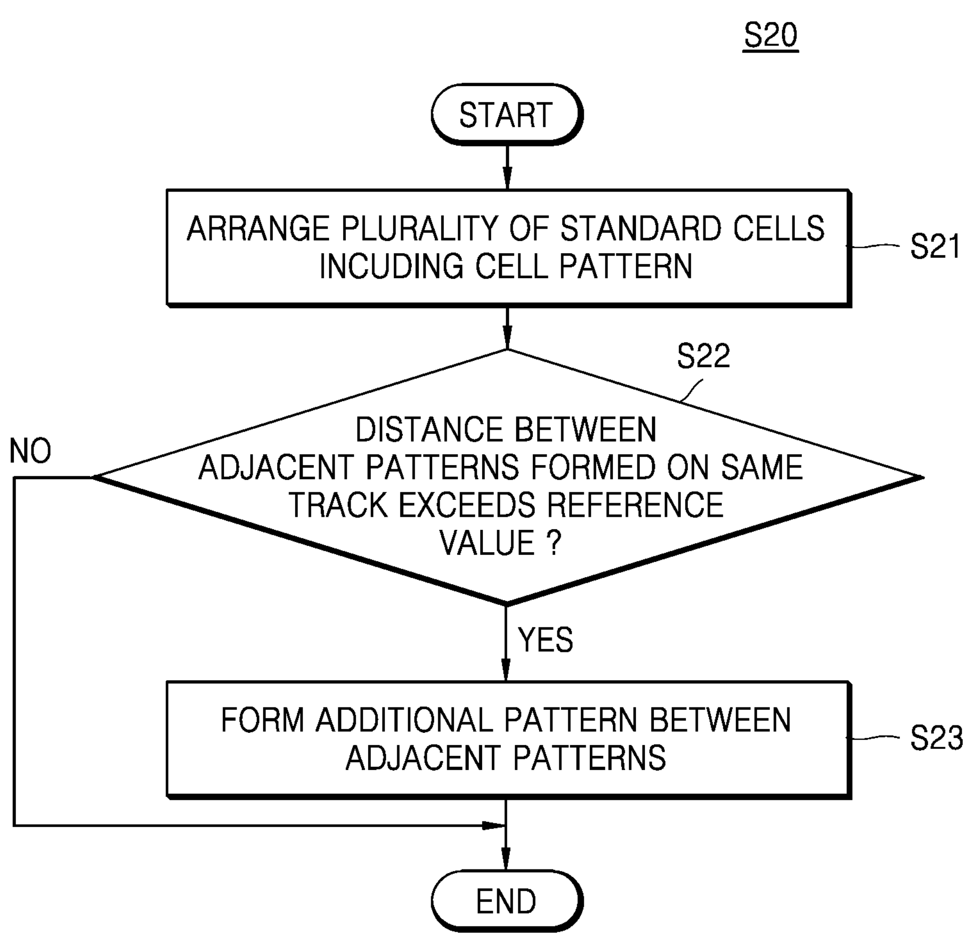
FIG. 7 is a flowchart of a method of manufacturing an integrated circuit, according to an example embodiment.

FIG. 7 is a flowchart for explaining a method of manufacturing an integrated circuit, according to an example embodiment. Operation S20 of FIG. 7 may be an example of operation S20 in FIG. 6, and may include operations S21 through S23.

Referring to FIG. 7, a plurality of standard cells including a cell pattern may be arranged (S21). For example, in operation S21, at least one of the standard cells C1, C1A, C1B, C2, C2A, and C2B described with reference to FIGS. 1 through 5 may be arranged.

It may be determined whether a distance between adjacent patterns formed on the same track among the plurality of tracks defined on a particular metal layer exceeds a reference value (S22). For example, it may be determined whether the width of a space (a T2T space), in which cell patterns of the plurality of standard cells are not formed, among the plurality of tracks, exceeds a reference value.

In this case, the reference value may be determined according to a designated value of the T2T space defined in the particular metal layer. In an example embodiment, the reference value may be set to be equal to or greater than the designated value, and for example, when the T2T space is set to have a plurality of designated values, the largest value among the plurality of designated values may be set to be the reference value. However, example embodiments are not limited thereto.

When the distance between adjacent patterns formed on the same track in a particular metal layer exceeds the reference value, an additional pattern may be formed between adjacent patterns (that is, in an empty region between the adjacent patterns) (S23). By forming an additional pattern, it may be possible to satisfy the T2T space requirements required in the particular metal layer.

Operations S22 and S23 may be performed on at least some of a plurality of metal layers formed in an integrated circuit. For example, operations S22 and S23 may be performed on the first metal layer M1 as illustrated in FIG. 1, and on the second metal layer M2 as illustrated in FIGS. 3 and 4, and also on the third metal layer M3 as illustrated in FIG. 5.

Figure 8:
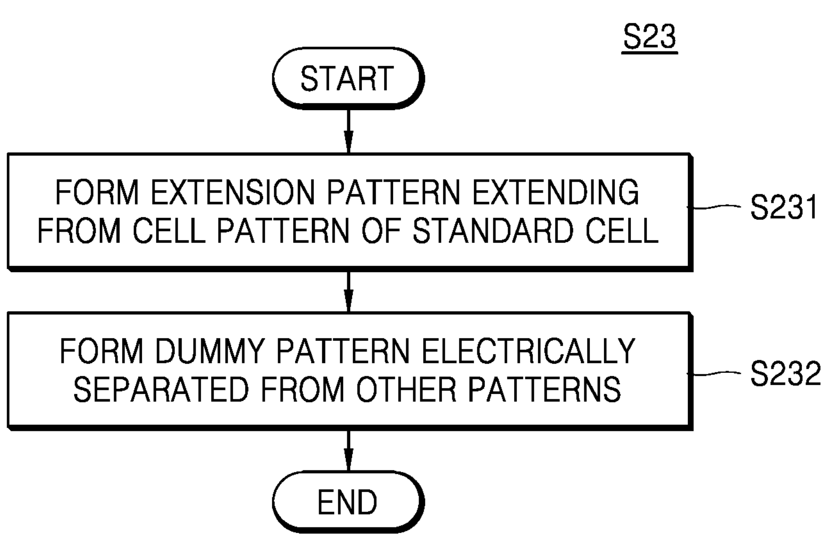
FIG. 8 is a flowchart of a method of manufacturing an integrated circuit, according to an example embodiment.

FIG. 8 is a flowchart for explaining a method of manufacturing an integrated circuit, according to an example embodiment. Operation S23 in FIG. 8 may be an example of operation S23 in FIG. 7, and may include operations S231 and S232. Operation S23 described with reference to FIG. 8 may be performed on at least one of a plurality of metal layers formed in an integrated circuit.

Referring to FIG. 8, an extension pattern extending from a cell pattern of a standard cell may be formed (S231). In an example embodiment, the extension pattern may be formed to extend from the input/output pin of the standard cell.

The extension pattern may be formed inside the cell boundary of the standard cell, or the extension pattern may also be formed over the standard cell and a standard cell adjacent thereto. This forming may be determined according to an interval of empty regions on a track, on which the extension pattern is to be arranged.

In operation S231, a via for connecting the extension pattern to a pattern of another layer may be further formed on the additionally formed extension pattern. For example, a via may be formed to contact the extension pattern for connecting a pattern of the upper layer of the metal layer, on which the extension pattern is formed, or for example, a via may be formed to contact the extension pattern for connecting a pattern of the lower layer of the metal layer, on which the extension pattern is formed.

A dummy pattern electrically separated from other patterns may be formed (S232). For example, the dummy pattern may be electrically separated from other patterns in the metal layer, on which the dummy pattern is to be formed, and may also be electrically separated from patterns formed in other metal layers. Accordingly, the dummy pattern may not be connected to (i.e., may be isolated from) the via.

As operations S231 and S232 are performed, even though a first logic cell and a second logic cell including the same cell patterns are arranged in operation S21 in FIG. 7, the extension pattern or the dummy pattern arranged on the first logic cell and the second logic cell may be different from each other. For example, the operation of forming the additional pattern (operation S23) may include an operation of forming a first additional pattern in the first logic cell and a second additional pattern having a pattern that is different from the first additional pattern in the second logic cell.

By forming an additional pattern including at least one of an extension pattern and a dummy pattern among a plurality of tracks, the method of manufacturing an integrated circuit, according to example embodiments, may satisfy T2T space requirements of a plurality of metal layers. For example, the integrated circuit 10 may include a metal layer having a full-track structure, in which patterns satisfying T2T space requirements are formed on all tracks.

Figure 9:
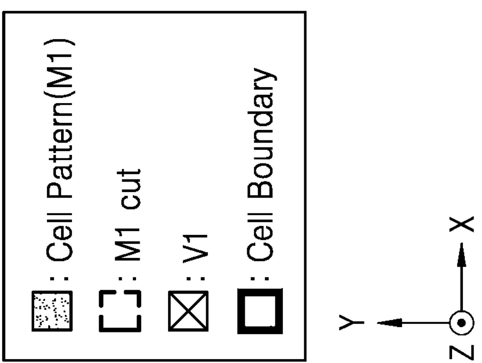
FIGS. 9 and 10 are diagrams of a method of designing an integrated circuit, according to example embodiments.
Figure 10:
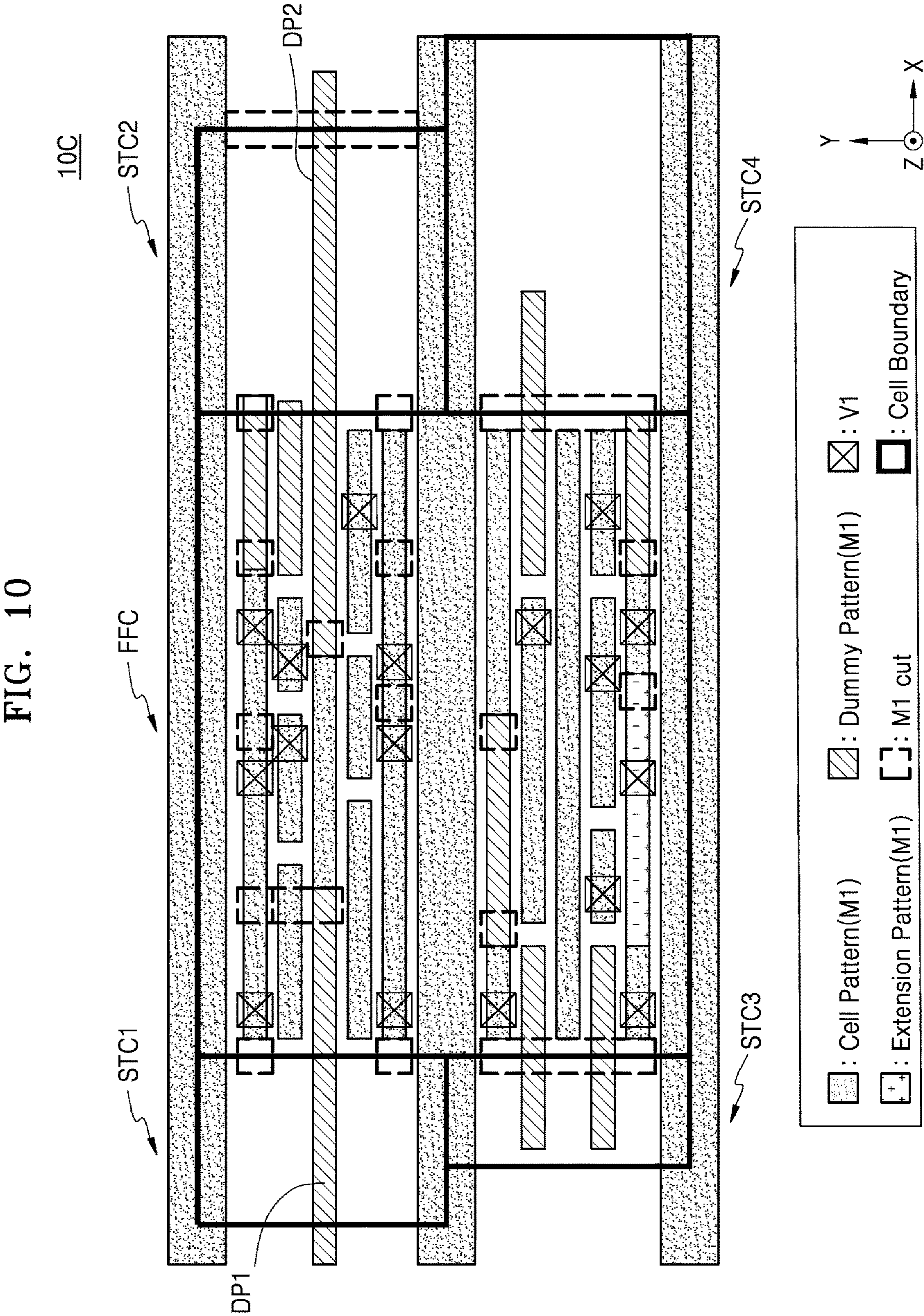

FIGS. 9 and 10 are diagrams for describing a method of designing an integrated circuit 10C, according to example embodiments. FIG. 9 is a layout of a standard cell FFC, and FIG. 10 is a layout of the integrated circuit 10C, in which the standard cell FFC of FIG. 9 is arranged. FIGS. 9 and 10 describe the patterns of the first metal layer M1, but the same descriptions may be applied to a plurality of metal layers other than the first metal layer M1.

Referring to FIG. 9, the standard cell FFC may include a flip-flop cell, in which a flip-flop is implemented. The standard cell FFC may be a multiple height cell arranged on the first row R1 and the second row R2. Data defining the layout of the standard cell FFC may be stored in the standard cell library D10 in FIG. 6.

First through tenth tracks TR11 through TR19 and TR10, in which the first metal layer M1 is arranged, may be formed on the standard cell FFC. The first through fifth tracks TR11 through TR15 may be arranged on the first row R1, and the sixth through tenth tracks TR16 through TR19 and TR10 may be arranged on the second row R2.

The standard cell FFC may include the cell patterns formed in the first metal layer M1. The standard cell FFC may further include the vias V1, which contact the cell patterns of the first metal layer M1 and are connected to the patterns of the upper layer of the first metal layer M1, as the cell patterns. In addition, the standard cell FFC may further include vias connecting the cell pattern to the gate line or the active region under the cell patterns of the first metal layer M1. An M1 cut region, in which the cell patterns of the first metal layer M1 are cut, may be defined in the standard cell FFC.

Referring to FIGS. 7 through 10, in operation S21, the standard cell FFC may be arranged in the integrated circuit 10C, and first through fourth adjacent cells STC1 through STC4 may be arranged adjacent to the standard cell FFC. After the standard cell FFC and the first through fourth adjacent cells STC1 through STC4 are arranged, additional patterns may be formed in the first metal layer M1 in operation S23. In addition, in operation S23, the vias V1 connecting the first metal layer M1 to the upper layer of the first metal layer M1 may be additionally formed, and the M1 cut region, in which the cell patterns and the additional patterns of the first metal layer M1 are cut, may be additionally defined.

For example, in the first through third, sixth, seventh, ninth, and tenth tracks TR11 through TR13, TR16, TR17, TR19, and TR10, a width of a space, in which the cell patterns of the standard cell FFC are not formed, may exceed the reference value. In operation S23, an extension pattern and a dummy pattern may be formed on the first through third, sixth, seventh, ninth, and tenth tracks TR11 through TR13, TR16, TR17, TR19, and TR10. An extension pattern may be formed on the tenth track TR10, and a dummy pattern may be formed on the first through third, sixth, seventh, ninth, and tenth tracks TR11 through TR13, TR16, TR17, TR19, and TR10.

The extension pattern may be formed to extend from the cell pattern of the standard cell FFC. The via V1 for connecting the extension pattern to the pattern of the upper layer may be formed on the extension pattern.

A first dummy pattern DP1 may be formed over the standard cell FFC and a first adjacent cell STC1, and a second dummy pattern DP2 may be formed over the standard cell FFC and a second adjacent cell STC2. The first dummy pattern DP1 may extend so that the first dummy pattern DP1 is not cut off at the cell boundary of the first adjacent cell STC1. For example, the first dummy pattern may be formed over at least three standard cells including the standard cell FFC and the first adjacent cell STC1.

Figure 11:
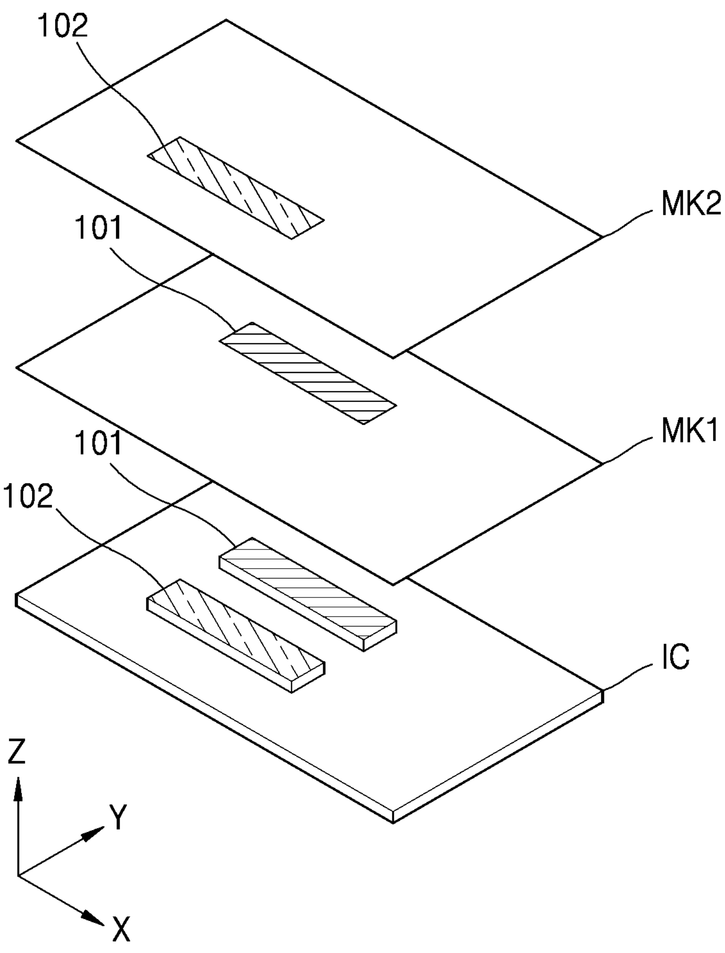
FIG. 11 is a diagram of a method of manufacturing an integrated circuit, according to an example embodiment.

FIG. 11 is a diagram illustrating a method of manufacturing the integrated circuit IC, according to an example embodiment.

Referring to FIG. 11, the integrated circuit IC may include a first pattern 101 and a second pattern 102 extending in a particular direction. For example, the first pattern 101 and the second pattern 102 may also include the pattern of the first metal layer M1 extending in the X-axis direction as described with reference to FIGS. 1, the pattern of the second metal layer M2 extending in the Y-axis direction as described with reference to FIGS. 3 and 4, or the pattern of the third metal layer M3 extending in the X-axis direction as described with reference to FIG. 5.

The first pattern 101 and the second pattern 102 may be patterns adjacent to each other. For example, when the first pattern 101 and the second pattern 102 are patterns of the first metal layer M1 in FIG. 1, the first pattern 101 may be arranged on the first track TR11, and the second pattern 102 may be arranged on the second track TR12.

In an example embodiment, the first pattern 101 and the second pattern 102 may be formed by using different masks from each other. The first pattern 101 may be formed by using a first mask MK1, and the second pattern 102 may be formed by using a second mask MK2. For example, when the first pattern 101 and the second pattern 102 include the patterns of the first metal layer M1 in FIG. 1, the patterns of the first, third, and fifth tracks TR11, TR13, and TR15 may be formed by using the first mask MK1, and the patterns of the second and fourth tracks TR12 and TR14 may be formed by using the second mask MK2. However, the method of manufacturing an integrated circuit, according to example embodiments, is not limited thereto, and patterns of metal layers may be formed by using three or more different masks, or all patterns of a particular metal layer may be formed by using one mask.

The first mask MK1 and the second mask MK2 may be generated in operation S40 in FIG. 6. The first pattern 101 and the second pattern 102 of the integrated circuit IC may be formed by performing various semiconductor processes on a semiconductor substrate, such as a wafer, by using the first mask MK1 and the second mask MK2. A desired pattern may be formed on a semiconductor substrate or a material layer by using a patterning process using the first mask MK1 and the second mask MK2.

Figure 12:
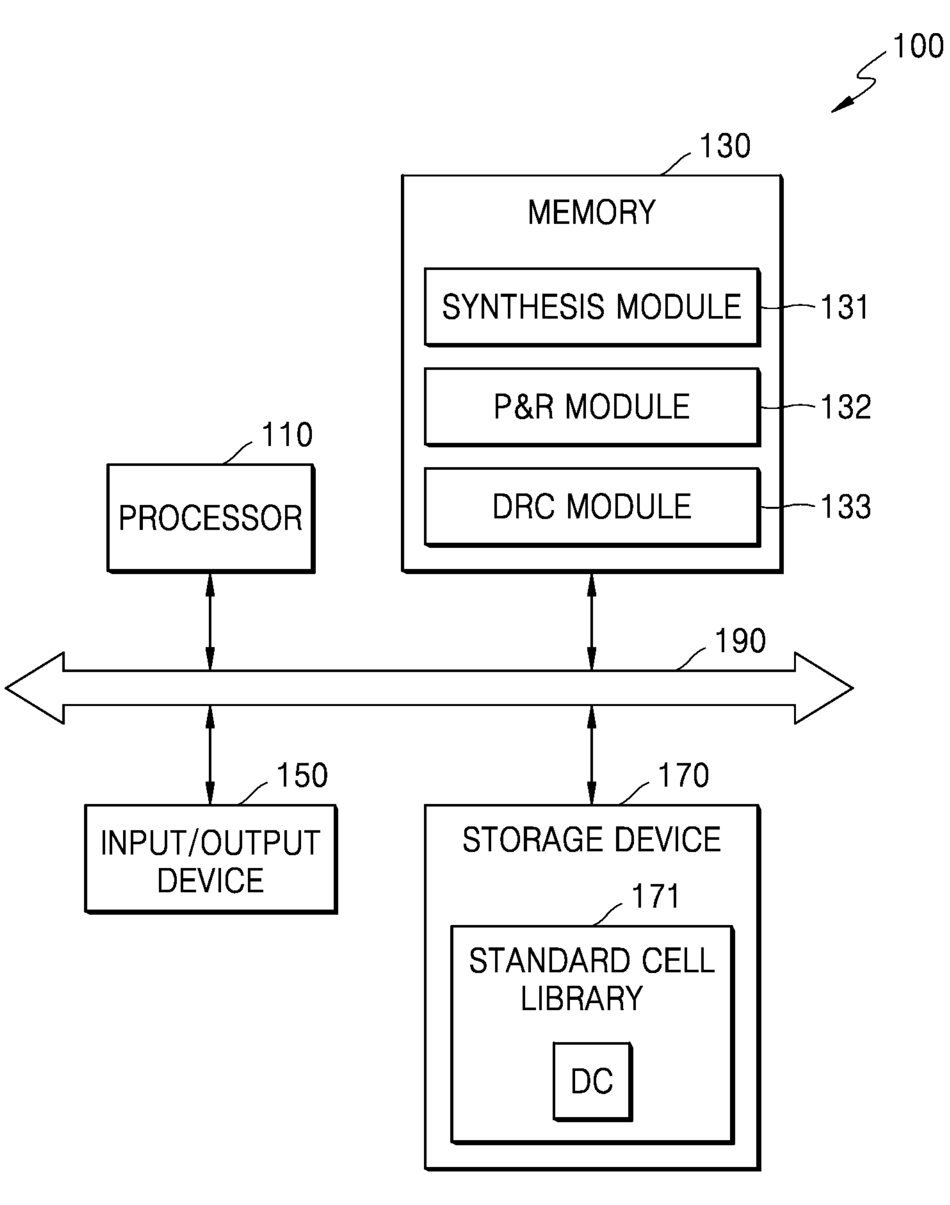
FIG. 12 is a block diagram of a computing system for designing an integrated circuit, according to an example embodiment.

FIG. 12 is a block diagram of a computing system 100 for designing an integrated circuit, according to an example embodiment.

Referring to FIG. 12, the computing system 100 (hereinafter, referred to as an integrated circuit design system) for designing an integrated circuit may include a processor 110, a memory 130, an input/output device 150, a storage device 170, and a bus 190. The integrated circuit design system 100 may perform the integrated circuit design operation including operations S10 and S20 in FIG. 6, operations S21 through S23 in FIG. 7, and operations S231 and S232 in FIG. 8. In an example embodiment, the integrated circuit design system 100 may be implemented as an integrated device, and accordingly, may be referred to as an integrated circuit design device. The integrated circuit design system 100 may be provided as a dedicated device for designing an integrated circuit of a semiconductor device, but may also include a computer for driving various simulation tools or design tools. The integrated circuit design system 100 may include a fixed computing system, such as a desktop computer, a workstation, and a server, or a portable computing system, such as a laptop computer.

The processor 110 may be configured to execute instructions performing at least one of various operations for designing an integrated circuit. For example, the processor 110 may include a core capable of executing an arbitrary command set (for example, Intel Architecture-32 (IA-32), 64-bit expansion IA-32, x86-64, PowerPC, Sparc, MIPS, ARM, IA-64, or the like), such as a micro-processor, application processor (AP), digital signal processor (DSP), and GPU. The processor 110 may communicate with the memory 130, the input/output device 150, and the storage device 170 via the bus 190. The processor 110 may perform a design operation of an integrated circuit by driving a synthesis module 131, a P&R module 132, and a design rule check (DRC) module 133.

The memory 130 may store the synthesis module 131, the P&R module 132, and the DRC module 133. The synthesis module 131, the P&R module 132, and the DRC module 133 may be loaded into the memory 130 from the storage device 170. The synthesis module 131 may include, for example, a program including a plurality of commands for performing logic synthesis operation according to operation S10 in FIG. 6. The P&R module 132 may include, for example, a program including a plurality of commands for performing a layout design operation according to operation S20 in FIG. 6.

The DRC module 133 may determine whether there is a design rule error. The DRC module 133 may include a program including a plurality of commands for performing the DRC operation including the design rule check operation according to operation S22 in FIG. 7. When there is a violation of the design rule, the P&R module 132 may adjust a layout of an arranged cell. When there is no design rule error, the layout design of an integrated circuit may be completed. In an example embodiment, the DRC module 133 may determine whether patterns formed on tracks defined on a particular metal layer satisfy T2T space requirements. The DRC module 133 may form an additional pattern when the distance between adjacent patterns formed on the same track exceeds the reference value.

The memory 130 may include a volatile memory, such as static random access memory (RAM) (SRAM) and dynamic RAM (DRAM), or a non-volatile memory, such as phase change RAM (PRAM), resistive RAM (ReRAM), nano floating gate memory (NFGM), polymer RAM (PoRAM), magnetic RAM (MRAM), ferroelectric RAM (FRAM), and a flash memory.

The input/output device 150 may control a user input and an output from user interface devices. For example, the input/output device 150 may receive an input data or the like defining an integrated circuit, by using an input device, such as a keyboard, a mouse, and a touch pad. For example, the input/output device 150 may display placement results, routing results, layout data, DRC results, or the like, by using an output device, such as a display and a speaker.

The storage device 170 may store programs, such as the synthesis module 131, the P&R module 132, and the DRC module 133, and a program or at least a portion thereof may be loaded into the memory 130 from the storage device 170 before the program is executed by the processor 110. The storage device 170 may store data to be processed by the processor 110 or data processed by the processor 110. For example, the storage device 170 may store data (for example, a standard cell library 171, netlist data, or the like) to be processed by a program, such as the synthesis module 131, the P&R module 132, and the DRC module 133, and data (for example, the DRC result data, the layout data, or the like) generated by the program. The standard cell library 171 stored in the storage device 170 may include the standard cell library D10 in FIG. 6.

For example, the storage device 170 may include a nonvolatile memory, such as electrically erasable programmable read-only memory (ROM) (EEPROM), a flash memory, PRAM, RRAM, MRAM, and FRAM, and a storage medium, such as a memory card (MMC, eMMC, SD, MicroSD, or the like), solid state drive (SSD), hard disk drive (HDD), a magnetic tape, an optical disk, and a magnetic disk. In addition, the storage device 170 may also be removable from the integrated circuit design system 100.

While aspects of example embodiments have been particularly shown and described, it will be understood that various changes in form and details may be made therein without departing from the spirit and scope of the following claims.

What is claimed is:

1. A method of manufacturing an integrated circuit comprising a plurality of metal layers, which are stacked, the method comprising:

providing a plurality of standard cells, each of which comprises a plurality of patterns respectively formed on the plurality of metal layers; and forming, on a metal layer among the plurality of metal layers which comprises patterns extending in a first direction that are respectively formed on a plurality of tracks that are spaced apart in a second direction, an extension pattern between adjacent patterns formed on a first track among the plurality of tracks based on an interval between the adjacent patterns exceeding a reference value, wherein the adjacent patterns and the extension pattern comprise a conductive material, and wherein the extension pattern extends from one of the adjacent patterns.

2. The method of claim 1, further comprising forming a dummy pattern on a second track among the plurality of tracks, wherein the dummy pattern extends over a first standard cell, a second standard cell, and a cell boundary between the first standard cell and the second standard cell.

3. The method of claim 2, wherein the dummy pattern comprises a conductive material.

4. The method of claim 1, wherein the forming the extension pattern comprises forming the extension pattern extending from a pattern of a first standard cell among the plurality of standard cells.

5. The method of claim 4, wherein the forming the extension pattern comprises forming the extension pattern over the first standard cell and a second standard cell adjacent to the first standard cell.

6. The method of claim 4, further comprising forming a via which connects the extension pattern to a pattern of another layer of the plurality of metal layers.

7. The method of claim 1, wherein the adjacent patterns formed on an identical track among the plurality of tracks are spaced apart by at least one designated value.

8. The method of claim 1, wherein the plurality of standard cells are electrically connected to a plurality of power rails extending in the first direction.

9. The method of claim 1, wherein the plurality of standard cells are electrically connected to a plurality of power rails extending in the second direction.

10. An integrated circuit comprising a plurality of metal layers, which are stacked, the integrated circuit comprising:

a first logic cell and a second logic cell, at least one of which comprising a plurality of patterns respectively formed on the plurality of metal layers, wherein a first metal layer among the plurality of metal layers comprises patterns extending in a first direction and a plurality of first tracks spaced apart in a second direction; and a dummy pattern formed on a first track among the plurality of first tracks over the first logic cell, the second logic cell and a cell boundary between the first logic cell and the second logic cell in the first metal layer, wherein the dummy pattern is separated from other patterns on the first metal layer, wherein the dummy pattern comprises a conductive material.

11. The integrated circuit of claim 10, wherein the plurality of metal layers are provided on a substrate, and wherein among the plurality of metal layers, the first metal layer is closest to the substrate.

12. The integrated circuit of claim 10, wherein the first logic cell and the second logic cell have an identical cell height in the first direction.

13. The integrated circuit of claim 10, wherein the first logic cell and the second logic cell have different cell heights in the first direction, wherein the plurality of metal layers are provided on a substrate, wherein, a second metal layer, among the plurality of metal layers, provided between the substrate and the first metal layer, comprises patterns extending in the second direction and a plurality of second tracks spaced apart in the first direction, and wherein, among the plurality of second tracks, a number of second tracks passing through a cell boundary of the first logic cell is different from a number of second tracks passing through a cell boundary of the second logic cell.

14. The integrated circuit of claim 10, wherein two patterns disposed adjacent to each other on the same first track among the plurality of first tracks are spaced apart by at least one designated value.

15. The integrated circuit of claim 10, further comprising an extension pattern formed on the first metal layer, and extending from a pattern of the first logic cell.

16. An integrated circuit comprising a plurality of metal layers, which are stacked, the integrated circuit comprising:

a first standard cell and a second standard cell, at least one of which comprises a plurality of patterns respectively formed on the plurality of metal layers, wherein a metal layer among the plurality of metal layers comprises patterns extending in a first direction and a plurality of first tracks spaced apart in a second direction; and an extension pattern formed on a first track among the plurality of first tracks over the first standard cell and the second standard cell in the metal layer, wherein the extension pattern is formed between two patterns on the first track and extends from a pattern among the two patterns, wherein the extension pattern extends from one of the two patterns, wherein the two patterns are adjacent each other and spaced apart by at least one designated value, and wherein the two patterns and the extension pattern comprise a conductive material.

17. The integrated circuit of claim 16, further comprising a dummy pattern on a second track among the plurality of first tracks, wherein the dummy pattern is electrically separated from other patterns in other first tracks among the plurality of first tracks, and wherein the dummy pattern extends over a cell boundary between the first standard cell and the second standard cell.

18. The integrated circuit of claim 17, wherein the dummy pattern comprises a conductive material.

19. The integrated circuit of claim 16, wherein the first standard cell and the second standard cell have different cell heights from each other in the first direction.

20. The integrated circuit of claim 16, further comprising a dummy pattern extending over the first standard cell, the second standard cell, and a cell boundary between the first standard cell and the second standard cell, wherein the dummy pattern is electrically separated from other patterns on the metal layer.

* * * * *